(12) United States Patent
Kydd et al.

(10) Patent No.: US 6,274,412 B1
(45) Date of Patent: Aug. 14, 2001

(54) MATERIAL AND METHOD FOR PRINTING HIGH CONDUCTIVITY ELECTRICAL CONDUCTORS AND OTHER COMPONENTS ON THIN FILM TRANSISTOR ARRAYS

(75) Inventors: Paul H. Kydd, Lawrenceville; Sigurd Wagner; Helena Gleskova, both of Princeton, all of NJ (US)

(73) Assignee: Parelec, Inc., Rocky Hill, NJ (US)

( * ) Notice: Subject to any disclaimer, the term of this patent is extended or adjusted under 35 U.S.C. 154(b) by 0 days.

(21) Appl. No.: 09/468,649

(22) Filed: Dec. 21, 1999

Related U.S. Application Data

(63) Continuation-in-part of application No. 09/367,783, filed on Aug. 20, 1999, which is a continuation-in-part of application No. 09/369,571, filed on Aug. 6, 1999.
(60) Provisional application No. 60/113,047, filed on Dec. 21, 1998.

(51) Int. Cl.$^7$ .............................. H01L 21/00; H01L 21/84; H01L 29/06; H01L 31/036; G01G 3/36
(52) U.S. Cl. .............................. 438/149; 438/159; 257/32; 257/59; 345/92; 505/191
(58) Field of Search ................................... 438/149, 159, 438/233, 597; 257/32, 59, 72; 345/92; 505/191

(56) References Cited

FOREIGN PATENT DOCUMENTS

| 03280416 | * 12/1991 | (JP) | .......................................... | 21/27 |
| 11109412 | * 4/1999 | (JP) | .......................................... | 1/136 |

OTHER PUBLICATIONS

H. Somberg, Ink Jet Printing for Metallization of Very Thin Solar Cells, IEEE, 666–667, 1990.*

Hayes et al., Micro–Jet Printing of Polymers for Electronics Manufacturing, IEEE, 168–173, 1998.*

* cited by examiner

Primary Examiner—Trung Dang
Assistant Examiner—Brook Kebede
(74) Attorney, Agent, or Firm—Woodbridge & Associates, P.C.; Richard C. Woodbridge

(57) ABSTRACT

A process sequence is disclosed for fabricating arrays of Thin Film Transistors by printing metallic conductors for the gate and data lines and possibly the Indium Tin Oxide Pixel electrode as well. The process eliminates conventional step-and-repeat photolithographic patterning, and provides high conductivity metallization for large arrays. These arrays may be used in displays, detectors and scanners.

7 Claims, 13 Drawing Sheets

PRINTED GATE PATTERN

PECVD STACK AND PHOTORESIST DEPOSITED

RESIST DEVELOPED AND $SiO_2$ ETCHED

PECVD (n⁺)a-Si:H AND SPUTTERED PLATINUM DEPOSITED ON RESIST

RESIST STRIPPED TO DEFINE THE SELF-ALIGNED CHANNEL

PRINTED TFT ARRAY

PRINTED ORGANIC RESIST ON DATA LINES AND TFTs

COMPLETE PRINTED TFT ARRAY WITH ITO PIXEL

FINISHED TFT

PRINTED ITO PIXEL

COMPLETE PRINTED TFT ARRAY WITH DATA LINES

MATERIAL AND METHOD FOR PRINTING HIGH CONDUCTIVITY ELECTRICAL CONDUCTORS AND OTHER COMPONENTS ON THIN FILM TRANSISTOR ARRAYS

CROSS REFERENCE TO RELATED APPLICATIONS

This disclosure claims priority from U.S. Provisional Patent Application No. 60/113,047 filed on Dec. 21, 1998 and is a Continuation-in-part of U.S. patent application Ser. Nos. 09/367,783 filed Aug. 20, 1999 and 09/369,571 Aug. 6, 1999.

BACKGROUND OF THE INVENTION

Materials have been developed for printing on substrates such as those used for printed wiring boards and flexible circuits. They offer the advantage that electrical conductors consisting of a pure, single-phase metal can be produced by a simple print-and-heat process instead of by the usual multi-step photolithographic etching process. This novel family of compounds, commercially available as PARMOD™ compositions from Parelec, LLC, which are disclosed in Applicants' co-pending U.S. application Ser. No. 09/367,783 filed Aug. 20, 1999, the application in total being hereby incorporated by reference. These compositions can be formulated into printing inks or pastes or toners. These formulations can be printed on a substrate and cured to well-consolidated films of pure metal in seconds. The fast curing capability of PARMOD™ compositions, as well as their ready application, makes it possible to use them to create complex thin metal objects by very simple and low-cost processes.

PARMOD™ mixtures contain a Reactive Organic Medium (ROM) and metal flakes and/or metal powders. The ROM consists of either a Metallo-Organic Decomposition (MOD) compound or an organic reagent, which can form such a compound upon heating in the presence of the metal constituents. The ingredients are blended together with organic vehicles, if necessary, to produce printing inks or pastes or toners for electrostatic printing. PARMOD™ toners and their use in electrostatic printing are disclosed in Applicants' co-pending U.S. application Ser. No. 09/369,571 filed Aug. 6, 1999, the application in total being hereby incorporated by reference. These inks and toners can be printed on a temperature sensitive substrate and cured to well-consolidated, well-bonded electrical conductors at a temperature low enough so that the substrate is not damaged. The curing process occurs in seconds at temperatures as much as 500° C. below those used for conventional sintering of thick film inks and pastes.

PARMOD™ mixtures function by deposition of material from decomposition of the MOD compound which "chemically welds" the powder constituents of the mixture together into a monolithic solid. In the case of metals this results in a porous but continuous metal trace which has a density approximately half that of bulk metal and an electrical conductivity per unit mass which is also approximately half that of bulk metal. This demonstrates that the printed PARMOD™ conductors are made up of continuous well-bonded metal rather than of individual particles that are in adventitious contact with each other.

Similar chemistry is used to produce well-bonded oxide structures as well by incorporating oxide powders of desired properties with the appropriate ROM, as disclosed in Provisional Patent application Ser. No. 60/099,040.

An important class of temperature sensitive substrates is semiconductor, particularly amorphous silicon. Amorphous silicon is represented by the symbol a-Si:H in recognition of the fact that the material in addition to having an amorphous (noncrystalline) structure also contains a nonstoichiometric amount of hydrogen, which is essential to its functioning as a semiconductor. a-Si-H is produced by Plasma Enhanced Chemical Vapor Deposition (PECVD) of silane on a substrate. The substrate temperature is maintained at close to 275° C. to obtain the desired material. If the temperature is raised above 275° C. in subsequent processing, the hydrogen tends to leave the amorphous silicon, degrading its performance. This limits the options for applying metallization to the semiconductor surface in the same way that polymer substrates impose a limit on printed wiring boards.

The primary use of amorphous silicon is to create arrays of Thin Film Transistors (TFTs) for example in Active Matrix Liquid Crystal Displays (AMLCDs); in active matrix x-ray detectors; and as linear photosensitive elements in scanners and fax machines. These displays and optical sensors function by controlling or measuring the voltage imposed on each pixel by an individual TFT which is in turn controlled by a matrix of gate lines and data lines, thus the term active matrix. These electrical connections extend from side to side of the display and must be as narrow as possible to avoid blocking the light which passes through the display. In addition the gate lines must be much less than a micrometer thick to allow the PECVD layers to be applied over them in the inverted field effect TFT structure without breaks or cracks. As displays become larger, the demands on the electrical conductivity of the gate and data lines become more stringent to maintain the desired framing rate of the display. The ability of PARMOD™ technology to provide high conductivity conductors such as copper and silver by a fast, low-cost method is very advantageous.

The typical AMLCD consists of a low alkali glass substrate on which the active matrix is deposited. The most common inverted TFT structure is shown in cross section in FIG. 1. A general description of the fabrication of conventional TFTs is described, for example, in "TFT/LCDs" by T. Tsukada of Hitachi (Gordon & Breach, N.Y. 1996). The first step is to deposit the gate lines, which are approximately 10 micrometers wide and less than 300 nanometers thick by conventional thin film lithographic technique. Metal, typically chromium or a molybdenum-aluminum alloy is evaporated onto the glass to the required thickness. The glass is coated with a photoresist, the resist is photoimaged by a step and repeat process using a mask in the same way that silicon wafers are imaged to produce individual integrated circuits. The resist is then developed by dissolving away the unexposed material, and the gate lines are patterned by etching away the exposed metal, after which the resist is stripped.

A major difference from semiconductor manufacture is that the glass substrate is much larger than any wafer, and it has to be 100% perfect. There is no possibility of throwing away individual transistors that are defective, as is done in conventional IC manufacture. This combination of large scale and intolerance of defects makes the production of AMLCDs by conventional technology difficult and expensive. Most of the expense is associated with the patterning steps. As a result, the difficulty and the expense escalate rapidly as the size of the display increases.

The gate line pattern is then covered by PECVD layers of 1) a silicon nitride gate dielectric; 2) a-Si:H; and 3) a thin layer of ($n^+$) a-Si:H, to make good electrical contact with the chromium and aluminum metallization for source and drain lines of the TFT. All of these layers can be applied one after the other in a single trip through the vacuum chamber of the CVD apparatus. The PECVD stack is then patterned by photolithography to create individual TFTs over each gate.

The Indium Tin Oxide (ITO) pixel is then sputter deposited and patterned photolithographically.

A chromium buffer layer is sputtered to a thickness of 10 nanometers to serve as a barrier between the sputtered aluminum source and drain metallization and the silicon and this is followed by the aluminum. The metal is patterned photolithographically to define the contact to the ITO pixel, which is also the TFT source, and the drain, which is part of the data line. The source-drain metallization serves as a mask to etch the (n$^+$) layer and part of the a-Si:H to form the channel.

The array is finished by a patterned SiN layer to passivate the exposed amorphous silicon.

The number of patterning steps is five in all with current photolithographic methods for patterning being expensive, time consuming, and using and producing toxic substances.

It is an object of this invention to eliminate most or all of the expensive photolithographic patterning steps by low-cost printing steps.

It is a further object of this invention to replace low-conductivity evaporated metallization by high conductivity printed silver, copper or gold PARMOD™ metallization.

It is yet a further object of this invention to replace sputtered ITO films with printed ITO films.

SUMMARY OF THE INVENTION

An isometric drawing of the proposed TFT structure is shown in FIG. 2. The driven element is the ITO pixel window deposited on the gate dielectric layer with a storage capacitor in parallel. The other side of the pixel is a common ITO conductive surface on another glass plate covering the whole array and forming the other side of the liquid crystal cell.

The gate lines are deposited directly on the glass substrate and run from side to side with projections for the individual TFT gates. These can be printed by electrographic means using a silver PARMOD™ toner which sticks to glass very well and can print lines of the required fineness and conductivity.

The gates are covered by a PECVD stack of $Si_3Ni_4$, a-Si:H, and $SiO_2$. The $Si_3Ni_4$ gate dielectric covers the entire array, and the ITO pixel and the data lines are printed on it. The silicon oxide layer is removed by etching, except at the transistor channel itself which is defined by a self-aligning procedure to achieve perfect registration with the gates over a large array independent of imperfections in the printed gate patter. (n$^+$) doped a-Si:H is deposited to provide good ohmic contact with the source-drain metallization. A 10 nm layer of platinum is evaporated onto the (n$^+$) to provide an interface to PARMOD™ metallization, which is electrostatically printed to form the data lines to connect to the source and drain of the TFTs and to make contact with the ITO pixel.

DETAILED DESCRIPTION OF THE INVENTION

A major problem in large displays is registration and alignment from step to step, particularly in aligning the gate with the channel that must be etched through the source-drain metallization and the (n$^+$) layer. The gate and the channel must line up within less than one micron for optimum functioning of the TFT.

In self-aligned TFTs the channel is formed directly over the gate line by applying a positive photoresist to the PECVD stack and exposing it from the back through the transparent substrate to solubilize the resist exactly in register with the opaque gate lines. The resist is developed to remove it except from above the gate and allow the channel to be formed in perfect registration with the gate regardless of the size of the array or the perfection of the gate pattern.
Process Steps The proposed process for fabrication of TFT arrays is illustrated for the case of an AMLCD in FIGS. 3–13.

Figure 1:
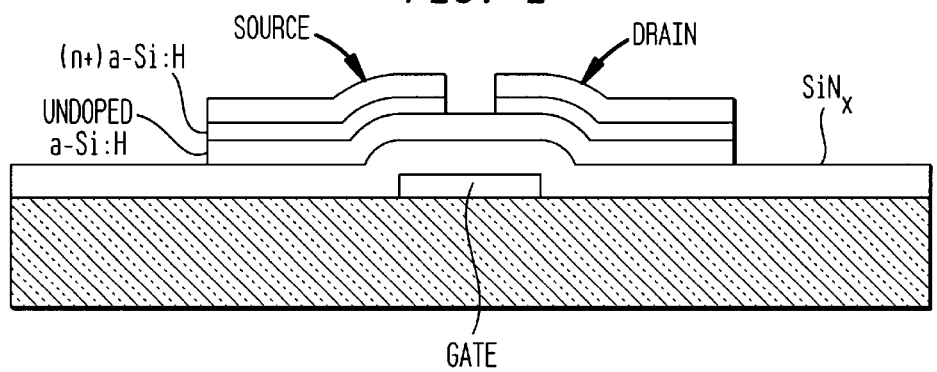
FIG. 1 is a cross-sectional view of the structure of an inverted Thin Film Transistor (TFT)
Figure 2:
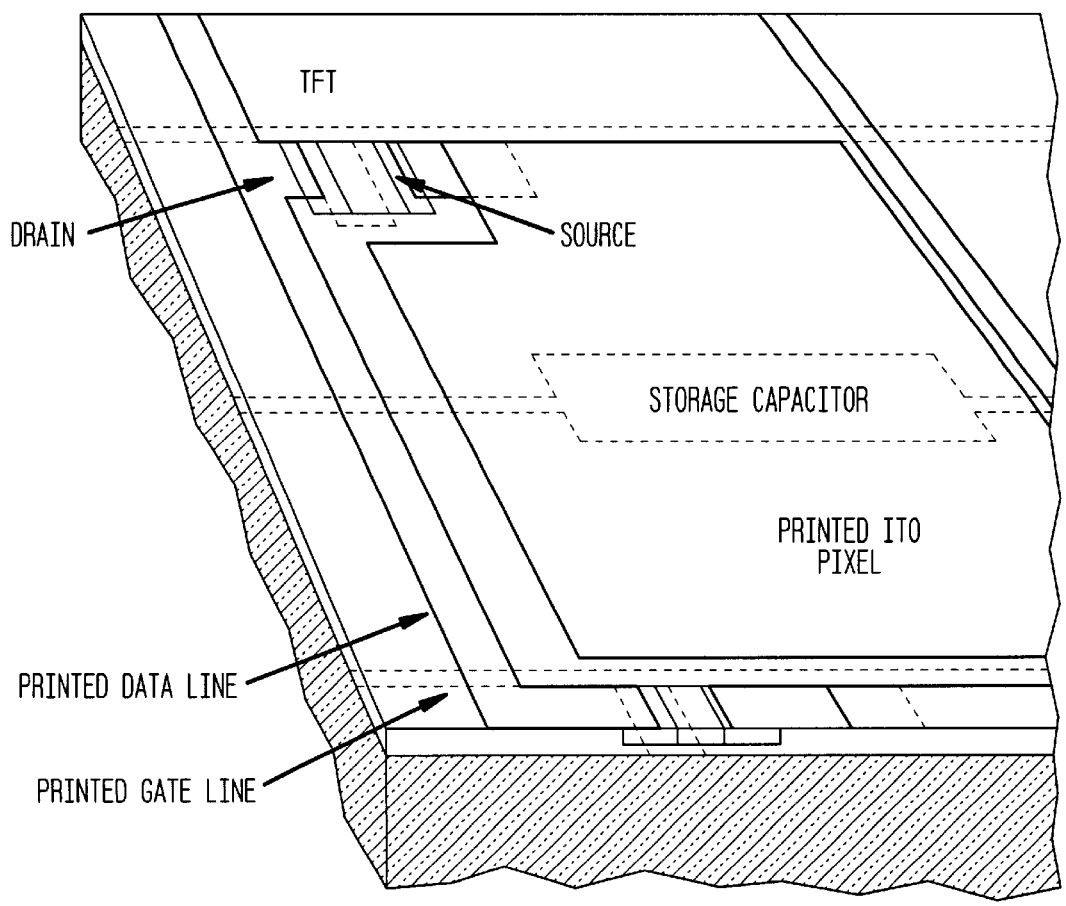
FIG. 2 is an isometric illustration of the layered structure of a TFT.
Figure 3:
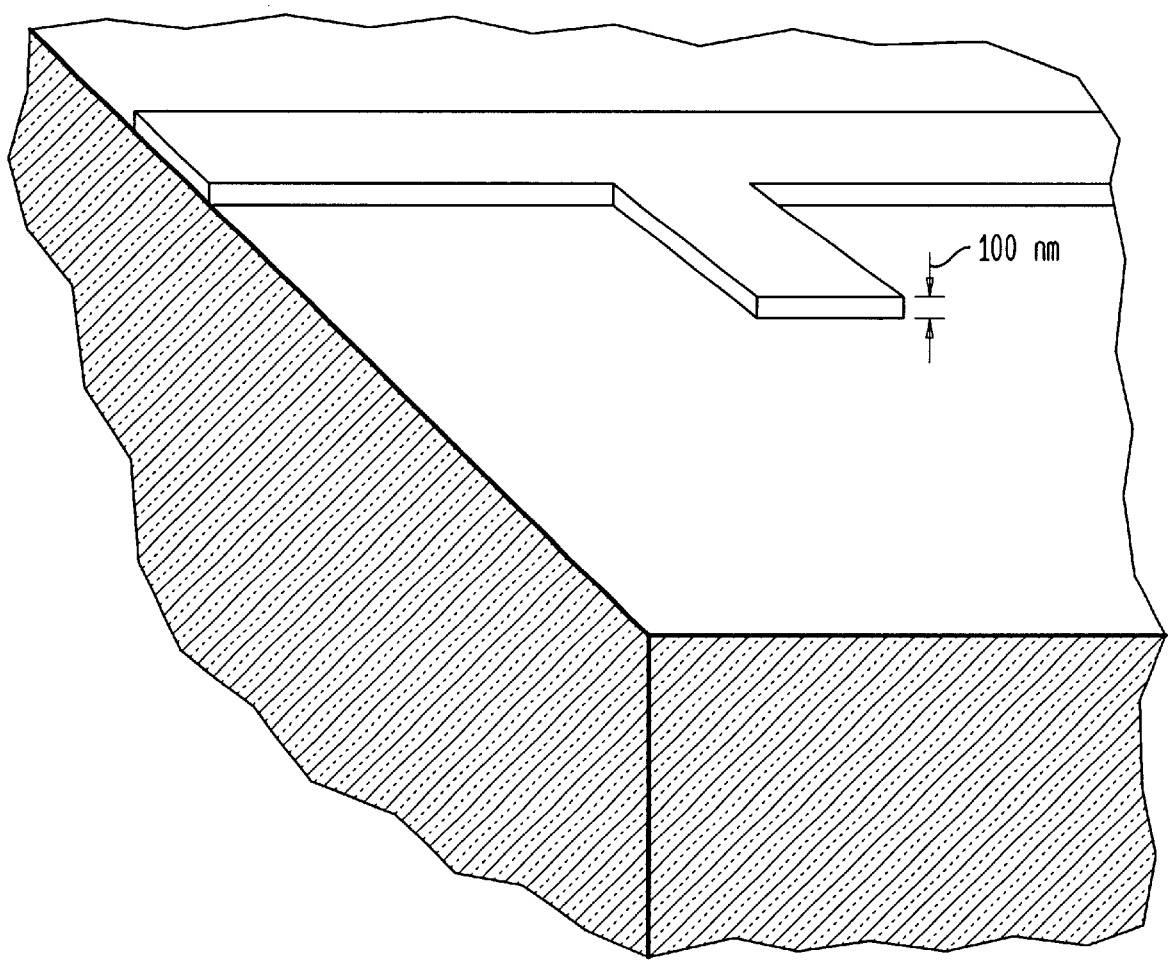
FIG. 3 is an illustration of the printed gate pattern on a glass substrate.

The gate metallization is first applied by electrostatically printing PARMOD™ silver toner on a low alkali glass substrate such as Corning 7059 and curing it at 400° C. to create a series of lines running between the pixels with tabs projecting at right angles to the lines to form the gates themselves. The gates will have a width equal to the final TFT channel length desired, as shown in FIG. 3. Extra capacitance can be added to the individual pixels by printing additional tabs on the gate lines which form a capacitor with the ITO layer of the pixel and the silicon nitride gate dielectric. Alternatively, separate storage capacitor lines with plates under the pixels and the gate dielectric can be printed simultaneously with the gate lines.

Next the first stack of silicon nitride, amorphous silicon, and silicon dioxide is deposited by PECVD. Under certain circumstances depositing silicon nitride by PECVD directly on the silver gate lines may damage the silver gate lines. Alternative methods of depositing silicon nitride which can protect the gate metallization include:

(a) Depositing the insulator using a room-temperature technique, e.g., sputtering.

(b) Depositing a more compatible dielectric first e.g., evaporated silicon monoxide.

(c) Depositing a polymer dielectric first, by spin-coating, then follow with a PE-CVD deposited dielectric. This technique has been used to planarize TFTs.

(d) Alloying the silver with Cr, and annealing it to form a self-passivating surface layer of Cr oxide, for example by mixing a Chromium MOD with the silver PARMOD superscript TM composition. This alloying technique has been used, for example, to self-passivate copper gate metal. Sirringhaus et al., "Self-Passivated Copper Gates for Amorphous Silicon Thin Film Transistors," IEEE Electron Device Letters 18, 388–390 (1997).

Figure 4:
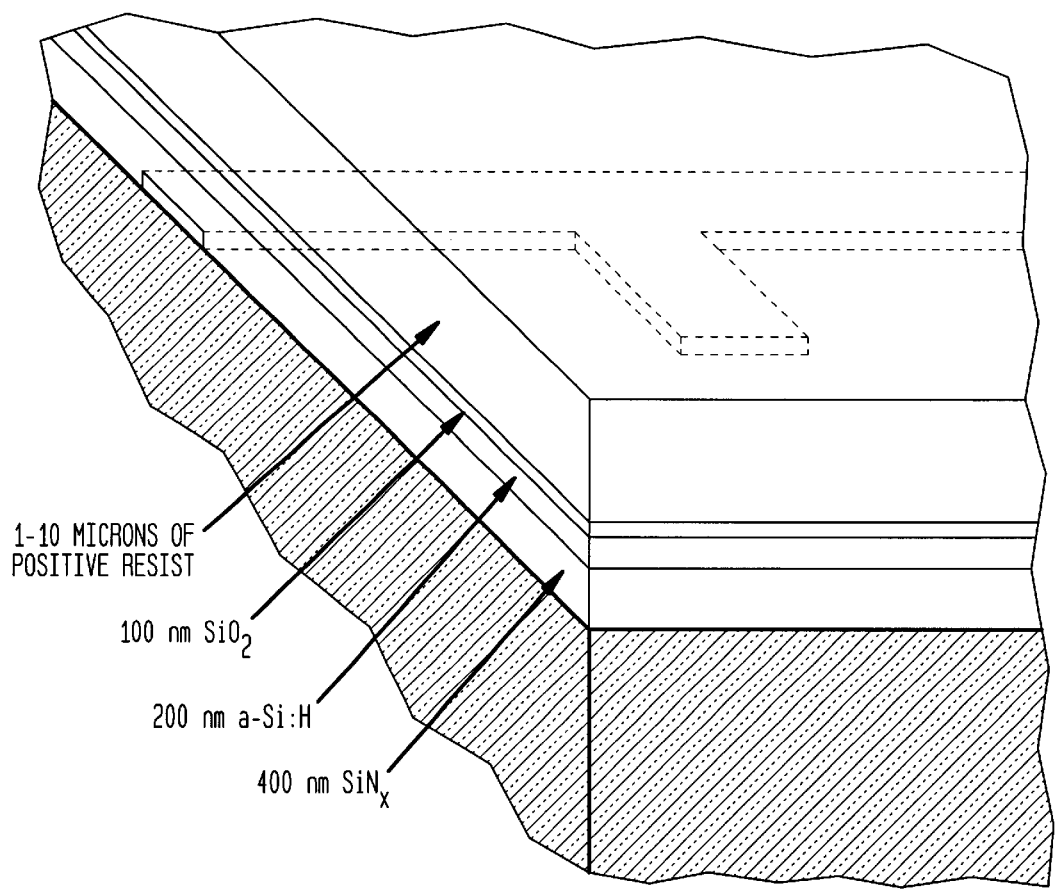
FIG. 4 is an illustration of a PECVD stack and photoresist deposited on the substrate.
Figure 5:
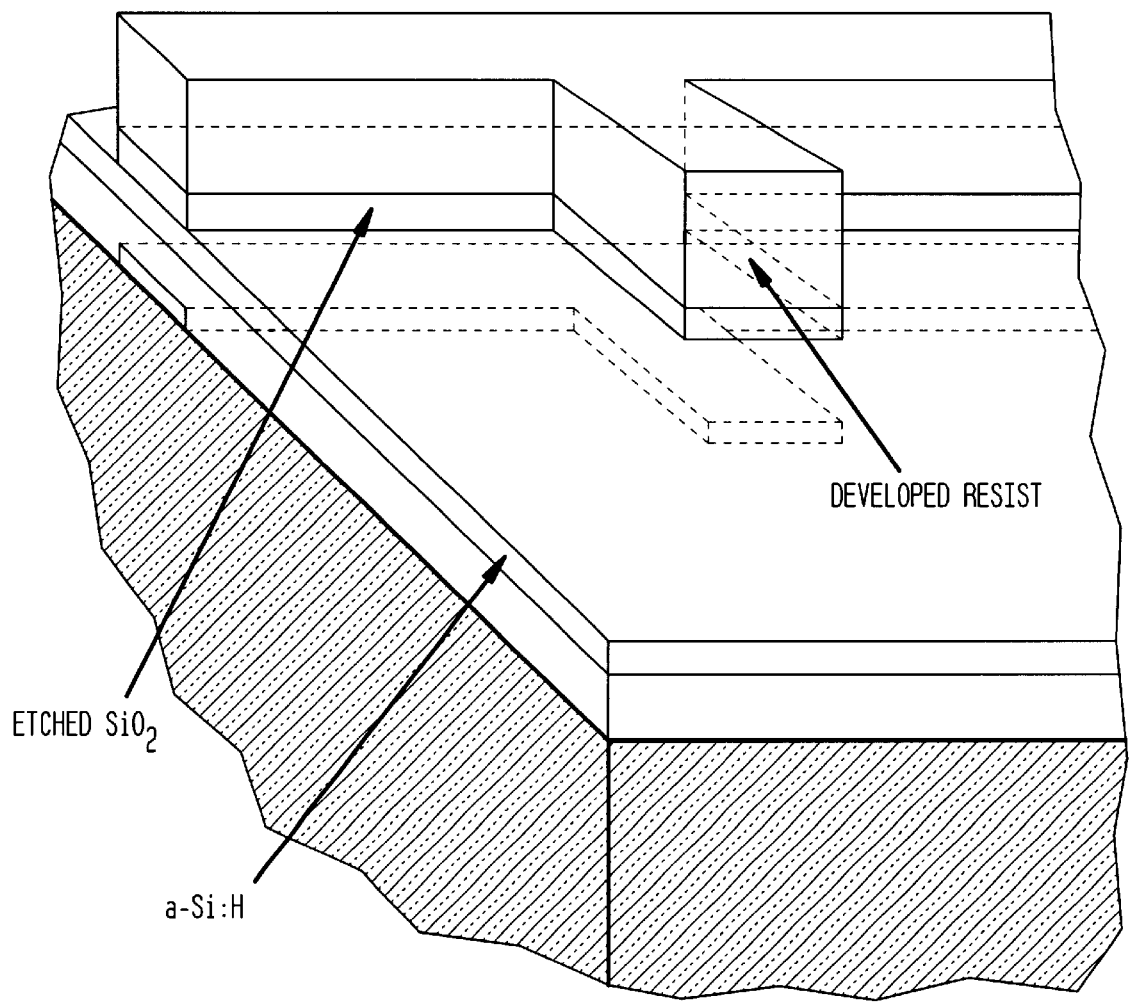
FIG. 5 is an illustration of a resist developed and silicon dioxide etched substrate.

Following the PECVD operation, the stack is coated, for example, by spin coating, with a positive resist to create the structure shown in FIG. 4. The resist is imaged by shining UV light up through the glass substrate so that the gate metal pattern automatically exposes the resist in perfect registration with the gate lines. This ensures that the channel is accurately located above the gate within less than a micrometer. The resist is developed to leave a series of islands over the gate lines. The silicon dioxide layer is etched away everywhere but under the resist to expose the amorphous silicon, as shown in FIG. 5.

Figure 6:
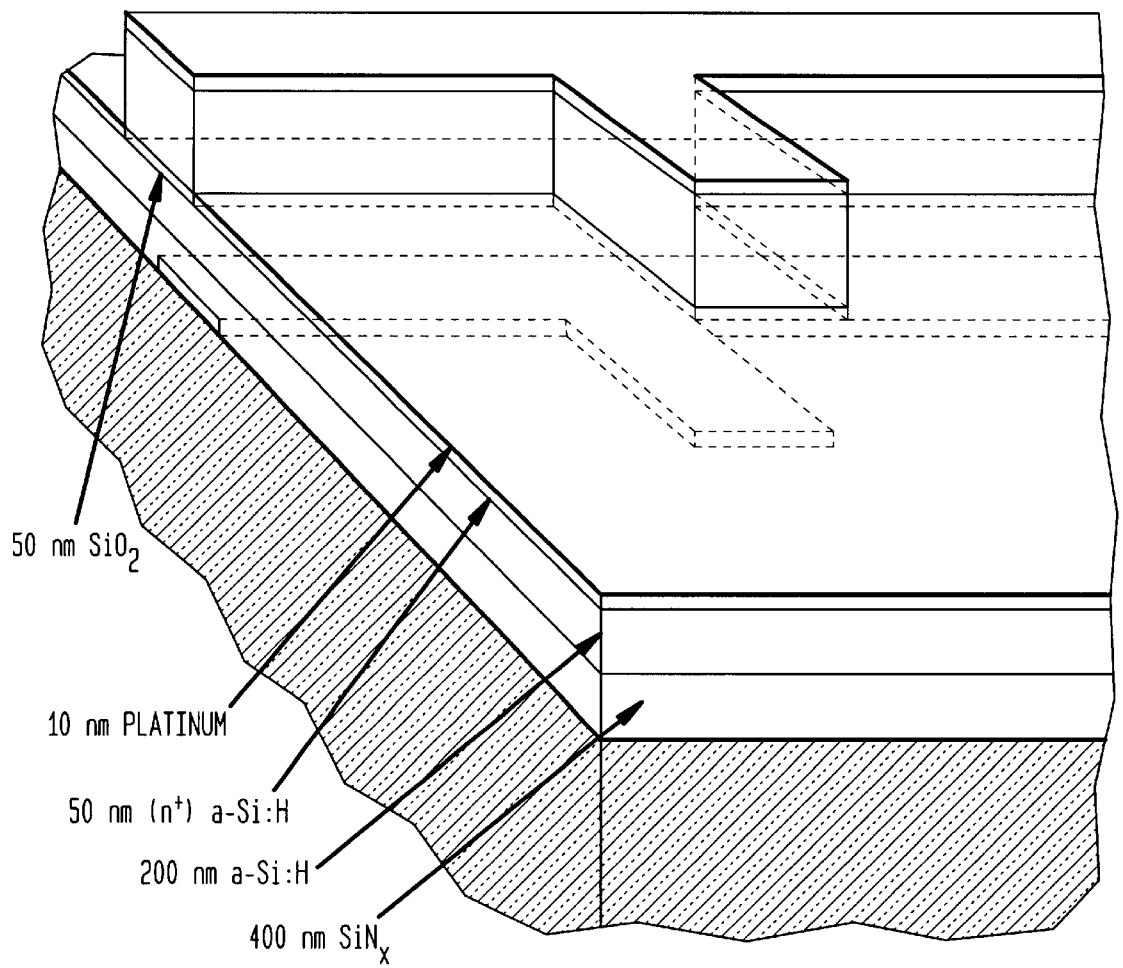
FIG. 6 is an illustration of amorphous silicon and platinum deposited on the substrate.
Figure 7:
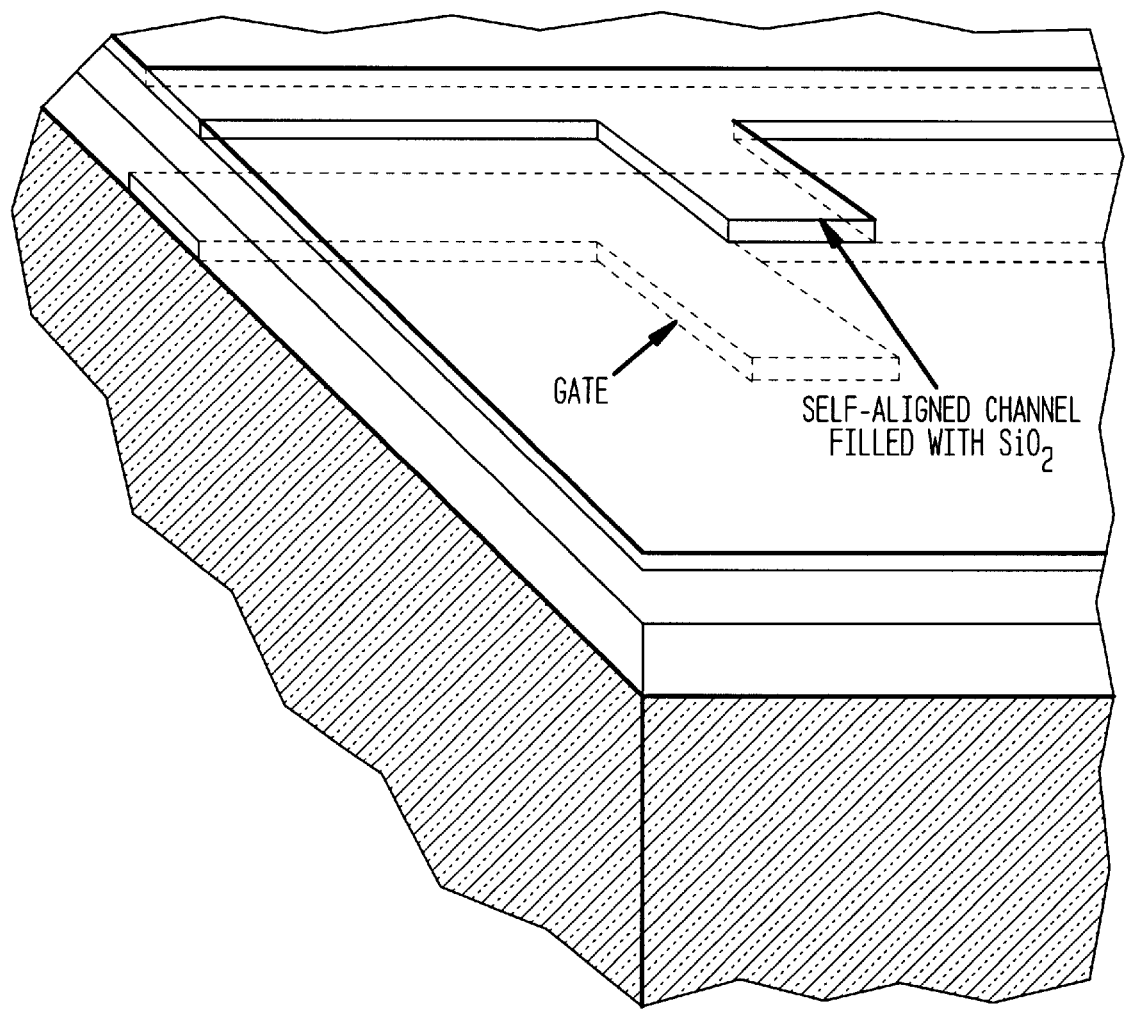
FIG. 7 is an illustration of a channel on a substrate filled with silicon dioxide.

Another PECVD operation is used to deposit $n^+$a-Si:H and platinum as bonding layers for the source-drain metallization, as shown in FIG. 6. The positive resist is then stripped to lift off the unwanted bonding layers and expose the channel which is filled and passivated with silicon dioxide, as shown in FIG. 7.

Figure 8:
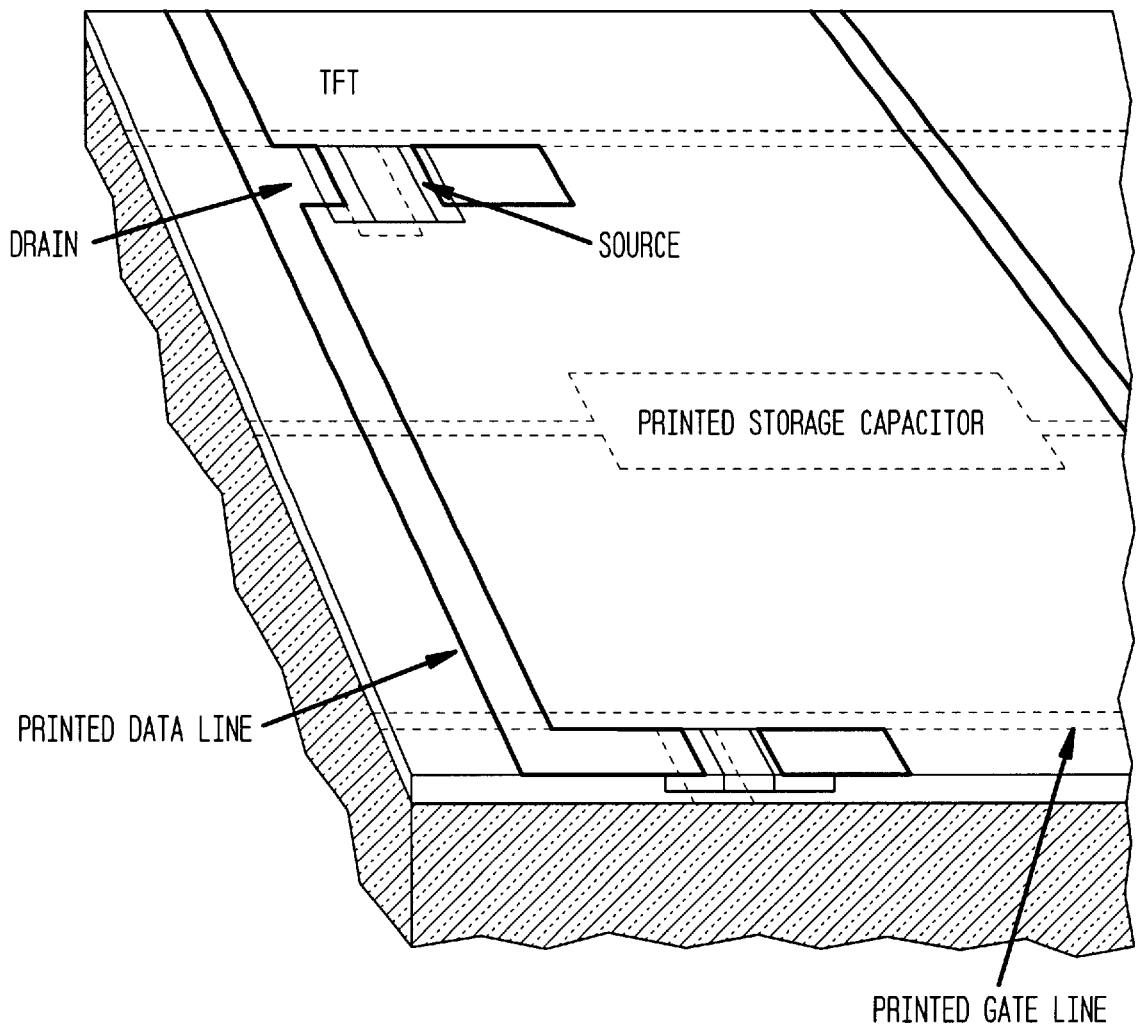
FIG. 8 is an illustration of source, drain and data lines printed on a substrate.

Next the source and drain metallization and the data lines are printed electrostatically with a PARMOD™ toner in a manner similar to the gate lines, but in most cases somewhat thicker to carry the increased current. The result is shown in FIG. 8. In most places the lines are printed over the bonding layers for good adhesion and good electrical contact. There is a short crossover above each gate line where the data lines are printed on silicon dioxide and where the adhesion will be less than on the platinum bonding layer, but the crossover is only 10–25 microns wide (less than 0.001 inch), and the data line is expected to bridge this successfully by virtue of the fact that the metal is welded into a single phase with some ductility.

Figure 9:
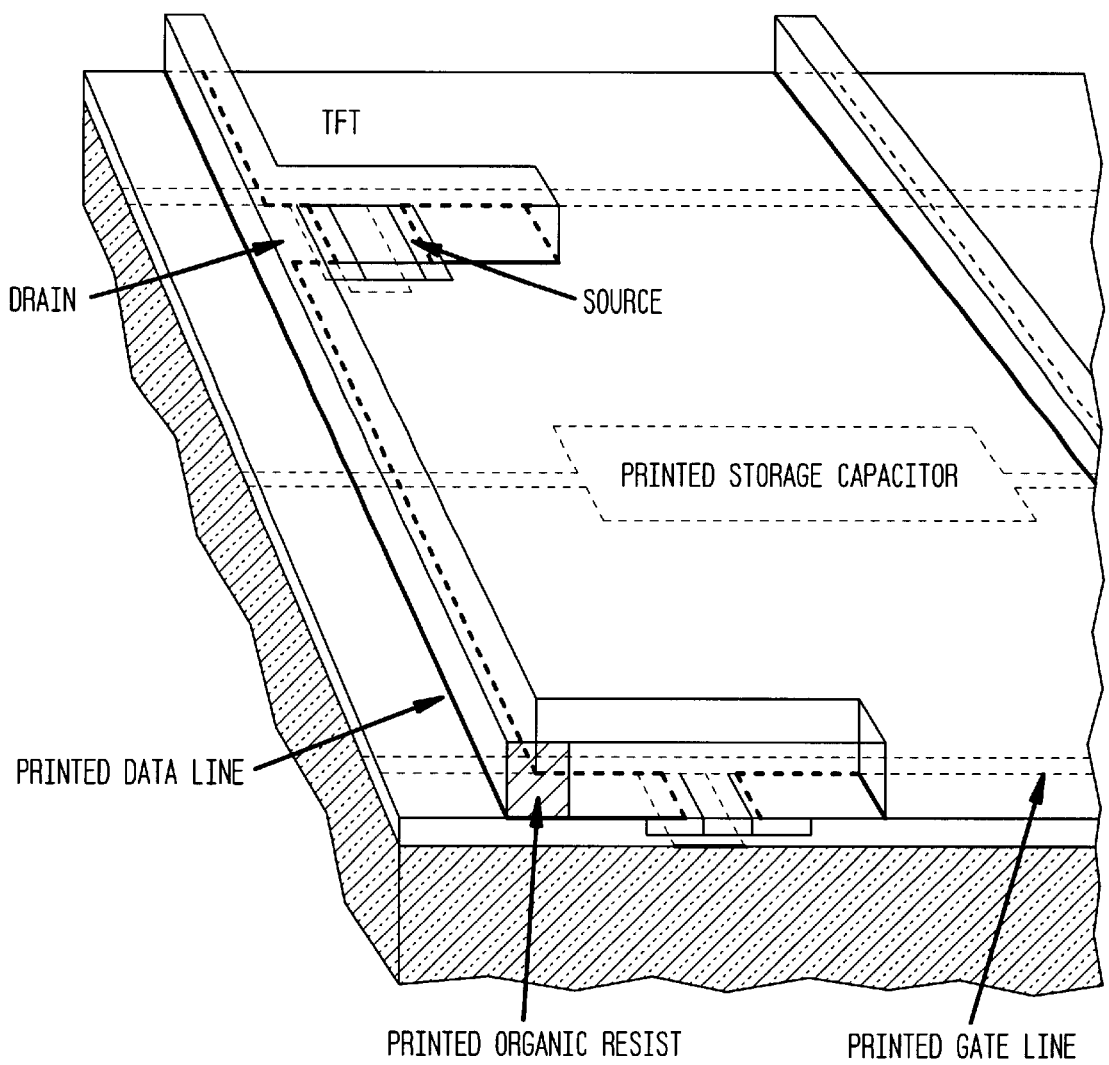
FIG. 9 is an illustration of an organic resist deposited on data lines on a substrate.

Following this step, an organic resist is printed to cover and protect the data lines, the source and the drain metallization, and the TFT channel, as shown in FIG. 9. This resist need not be located more accurately than 10 microns, and thus can be applied by a conventional printing process rather than photolithography. Laser printing directly on the TFT array or on a transfer medium from which the array of resist lines can be applied to the TFT array, following methods well known in the art, for example, H. Gleskova, et al., Journal of Noncrystalline Solids, 1998, 227–230, 1217–1220, can be used.

An alternative, if a resist consistent with the desired PECVD conditions cannot be used, is to strip the resist after etching the silicon dioxide and deposit the $n^+$a-Si:H and platinum over the entire structure, using the source-drain metallization as a resist to pattern it. In this case the printed resist would not cover the channel which would be opened by the next etching step. It is important to note that the channel width and alignment is defined by the self patterning step that patterns the silicon dioxide channel passivation. The source-drain metallization will overlap the silica by an amount that is determined by the printing accuracy, but that is less critical to the operation of the TFT than the length of the channel and its alignment with the gate.

The bonding layers of platinum, the ($n^+$) a-Si:H and the intrinsic a-Si:H are then etched off the unprotected areas, leaving the bare $SiN_x$ gate dielectric on which the ITO pixel is printed. The printing overlaps the source metallization to make the electrical connection between the TFT and the pixel. Printing technology well known in the art can produce transparent, conductive well-bonded ITO patterns, for example see, J. J. Xu, et al., Thin Solid Films, 1988 161, 273–280. If this can be done under conditions that do not destroy the TFT already deposited, e.g. a temperature less than approximately 200° C., this is the most desirable course.

Figure 10:
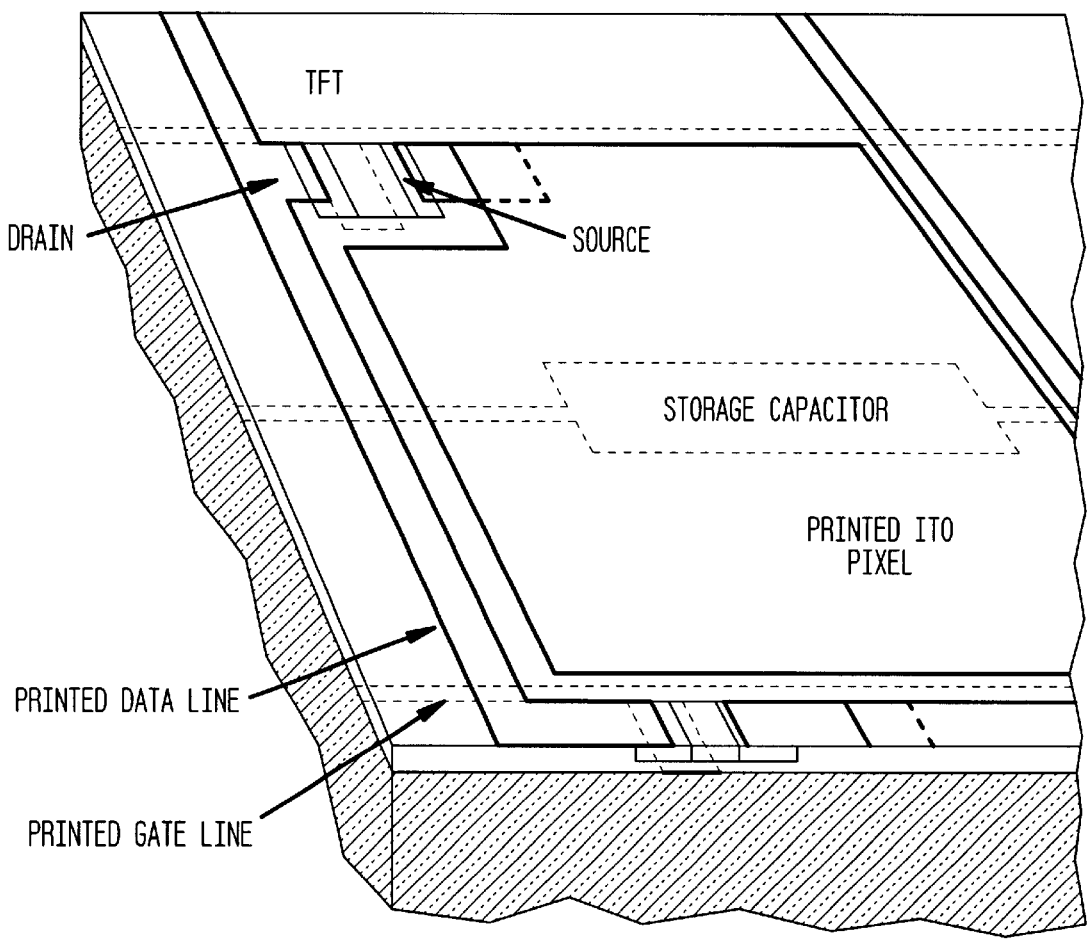
FIG. 10 is an illustration of a TFT on a substrate with a printed ITO pixel.

The organic resist is then stripped, and the ITO is heat cured to produce the finished array shown in FIG. 10.

An alternative to the ITO printing step is to use the organic resist shown in FIG. 9 to outline the pixel and to deposit ITO by conventional ambient temperature sputtering from an ITO target, followed by stripping the resist to isolate the pixel and finish the array.

Figure 11:
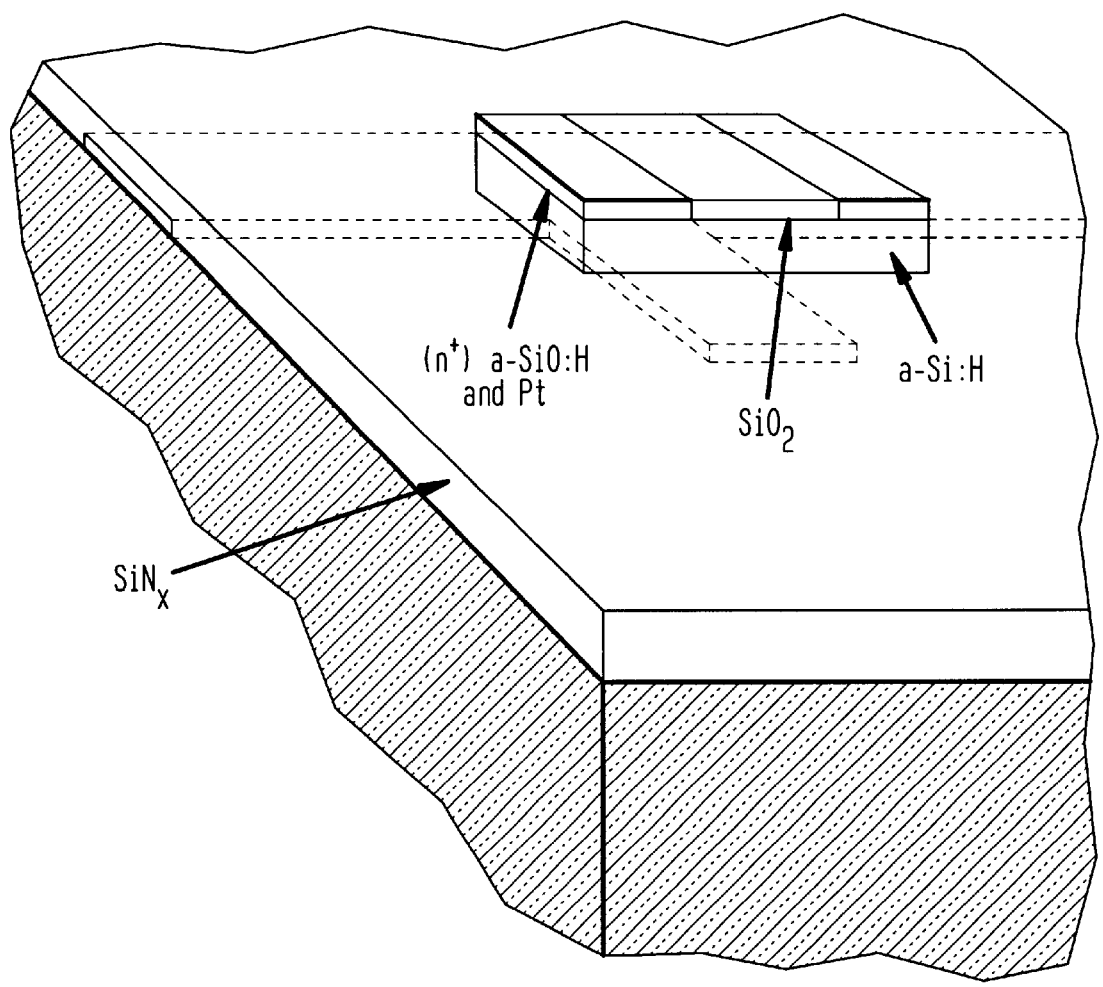
FIG. 11 is an illustration of an isolated TFT on a substrate.

A somewhat more conventional processing sequence, which can be used if the data line metallization can be made to adhere to silicon nitride, is to print the data lines directly on the gate dielectric after the ITO pixel is applied. In this case an organic resist is printed to outline the TFT after stripping the resist to outline the channel in FIG. 7. The excess bonding layers and the intrinsic a-Si:H are etched away leaving the TFTs as isolated islands on the exposed $Si_3Ni_4$ gate dielectric, as shown in FIG. 11.

The ITO window is now applied to the gate dielectric layer by printing or sputtering. For the direct printed approach an ITO precursor composition will be printed directly on the $Si_3Ni_4$ dielectric with adequate clearance to avoid shorting to the TFTs or the data lines to come. The resist will be removed from the TFT, and the ITO layer will be heat treated to develop its properties.

Figure 12:
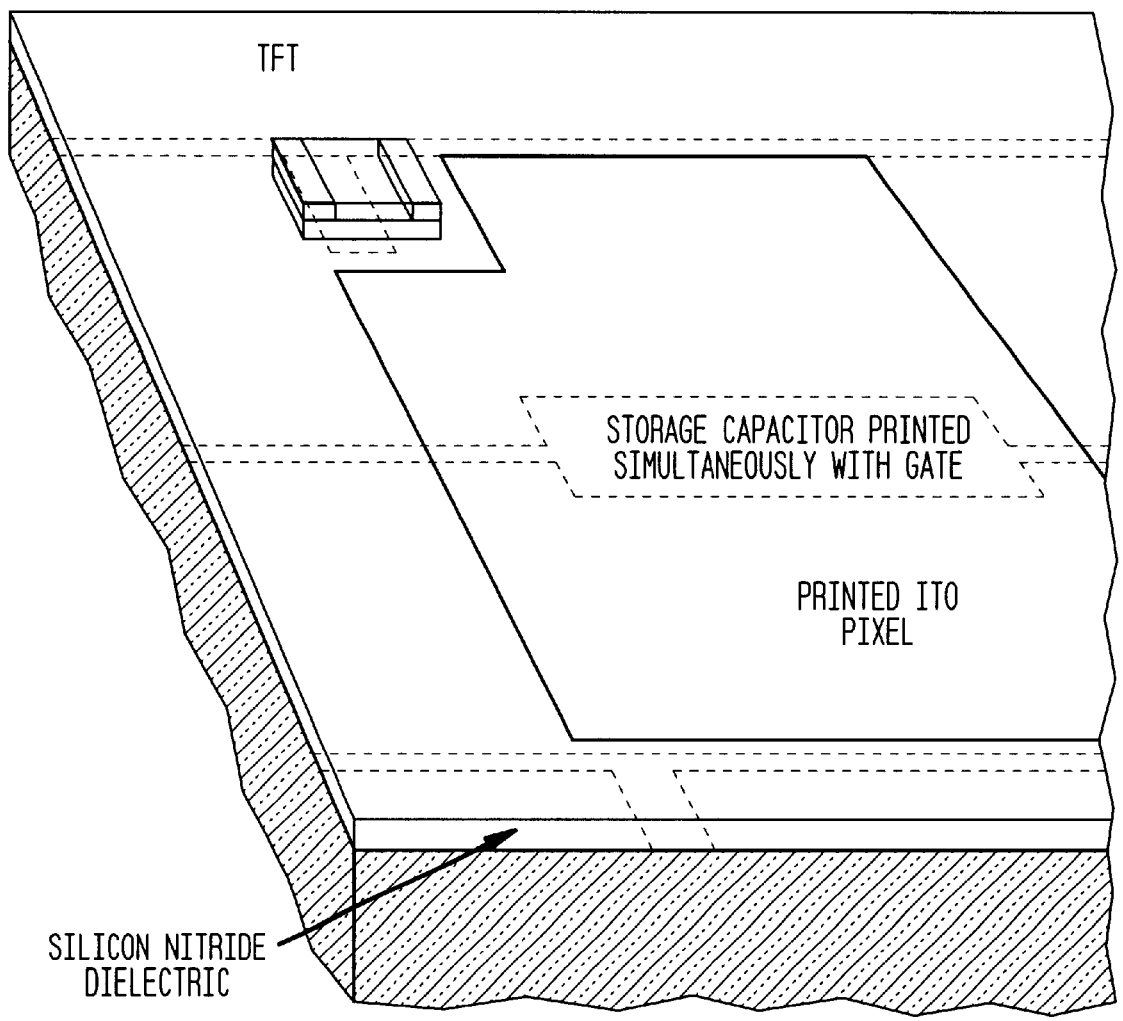
FIG. 12 is an illustration of a printed ITO pixel on a substrate.

For the sputtered approach a resist layer will be printed over the TFT to define the window and ITO applied to the entire array by sputtering. Following sputtering, the resist will be stripped taking the unwanted ITO with it. Alternatively the resist can be left on the TFTs from the previous step and ITO can be sputtered over the whole array as before. Then another layer of resist is printed to protect the ITO windows, and the excess ITO removed by wet etching followed by stripping the resist from the transistors. The resulting structure is the same in all cases, and is shown in FIG. 12.

Figure 13:
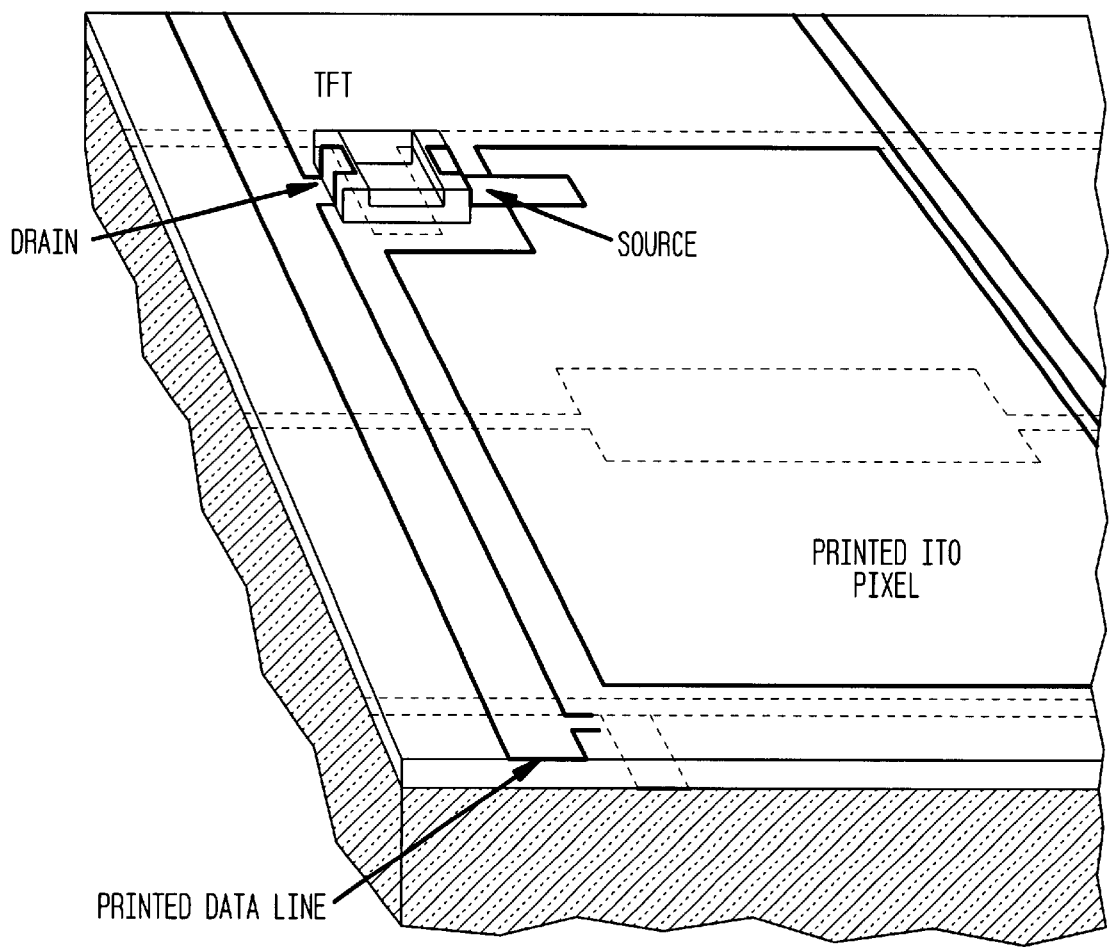
FIG. 13 is an illustration of complete printed TFT array with data lines on a substrate; and, FIG. 14 is a graph of source-drain current as a function of gate voltage for a TFT of the present invention.

Following the application of the ITO, the circuit is connected by printing the data lines with connections to the drains and from the ITO to the sources as shown in FIG. 13. The finished array is then passivated with a layer of polyimide, which is buffed to provide the attachment layer for the liquid crystal cell.

It can be understood by those skilled in the art that this method of forming arrays of TFTs can be applied to many products requiring arrays of thin film transistors. Scanners and fax machines are examples of linear arrays of TFTs that could be made in this manner. X-ray detectors are an example of two-dimensional arrays. Organic light emitting diode displays use arrays of TFTs with two to four transistors per pixel. These also can be made by the technique described above with suitable elaboration for the greater complexity. The essence of the invention is the application of the metallization to the array by printing, preferably electrostatic printing, in a way which eliminates the need for expensive photolithographic processing and which provides high-conductivity metallization which can support truly large-scale displays.

PARMOD™ Compositions

Preferred compositions which are useful in the above method are comprised of a metal mixture and a Reactive Organic Medium (ROM). These compositions can be applied to thermally stable substrates and cured to well-consolidated circuit traces and objects by heat treatment.

The compositions exhibit a critical temperature above which they undergo a transformation to well-consolidated electrical conductors with a resistivity only two to four times the bulk resistivity of the metal in question. The electrical conductivity is equal to that obtained by conventional high temperature metal powder sintering in conventional thick film compositions on ceramic substrates. Remarkably, this consolidation process takes place at temperatures 400 to 500 degrees Celsius lower than with compounds conventionally used in thick film technology, and in times which are an order of magnitude shorter than are required for sintering.

Suitable metals include copper, silver, gold, zinc, cadmium, palladium, iridium, ruthenium, osmium, rhodium, platinum, iron, cobalt, nickel, manganese, indium, tin, antimony, lead, bismuth and mixtures thereof.

In a preferred embodiment for screen printing circuit traces/components, the metal mixture contains metal flake and colloidal or semi-colloidal metal powder where the total of flake plus powder is preferred to be 60–85% of the total mixture, and the powder is preferred to be 30–50% of the total metal. Larger amounts of organic vehicle may be added to reduce viscosity for certain applications.

The metal flakes have a major dimension between 2 to 10 micrometers, preferably about 5 micrometers, and a thickness of less than 1 micrometer. They can be produced by techniques well known in the art by milling the corresponding metal powder with a lubricant, which is frequently a fatty acid or fatty acid soap. The starting powders are usually produced by chemical precipitation to obtain the desired particle size and degree of purity. The flakes are sold for electronic applications as constituents of thick film inks and silver-loaded conductive epoxies.

The flakes perform several functions. They form a skeleton structure in the printed image which holds the other ingredients together and prevents loss of resolution when the mixture is heated to cure it. The flakes naturally assume a lamellar structure like a stone wall which provides electrical conductivity in the direction parallel to the surface of the substrate and provides a framework to lessen the amount of metal transport necessary to achieve the well-consolidated pure metal conductors which are the objective of this invention. They also provide low surface energy, flat surfaces to which the other constituents of the composition can bond.

The other metallic powder mixture constituent of the present invention are preferably colloidal or semi-colloidal powders with individual particle diameters below about 100 nanometers, preferably less than about 50 nanometers. The colloidal or semi-colloidal powder is preferably present in about 40% by weight of the total weight of the metal powder mixture. A primary function of these powders is to lower the temperature at which the compositions will consolidate to nearly solid pure metal conductors. The presence of fine metal powder has been found to be helpful in advancing this low temperature process with silver and essential to the consolidation of copper mixtures. It is important that they be present as individual particles. Metal particles this small have a strong tendency to agglomerate into aggregates with an open skeletal structure.

Colloidal silver particles with a nominal diameter of 20 nanometers were shown to have an excellent state of dispersion and have been used in silver compositions and lowered the critical consolidation temperature from 300 to 260 degrees C.

To achieve and preserve the desired degree of dispersion of colloidal metal it is essential to stabilize the particles so that they cannot aggregate. In the case of the silver particles they were stabilized by the presence of a surfactant which coated the surface of the particles and prevented metal-to-metal contact. Suitable surfactants include carboxylic acids and metal soaps of carboxylic acids. This favors chemical precipitation as a means of producing the powders, since they can be exposed to an environment which promotes stabilization from formation to final consolidation.

The Reactive Organic Medium (ROM) provides the environment in which the metal mixture is bonded together to form well-consolidated conductors. Many classes of organic compounds can function as the ROM. The common characteristic which they share and which renders them effective is that they have, or can form, a bond to the metal via a hetero-atom. The hetero-atoms can be oxygen, nitrogen, sulfur, phosphorous, arsenic, selenium and other nonmetallic elements, preferably oxygen, nitrogen or sulfur. This bond is weaker than the bonds holding the organic moiety together, and can be thermally broken to deposit the metal. In most cases the reaction is reversible, so that the acid or other organic residue can react with metal to reform the metallo-organic compound, as shown schematically below:

$$R\text{–}M \Leftrightarrow R+M \qquad \text{I)}$$

where R is a reactive organic compound and M is the metal.

As an illustration of PARMOD™ mixtures containing MOD forming constituents such as organic acids, the reactions which take place in curing are as follows:

$$\text{Acid+Metal powder} \Rightarrow \text{MOD+H}_2 \qquad \text{IIa.)}$$

or $$\text{Acid+Metal Oxide} \Rightarrow \text{MOD+H}_2\text{O} \qquad \text{IIb)}$$

and $$\text{MOD+heat+H}_2\text{O} \Leftrightarrow \text{Bulk Metal+Acid} \qquad \text{III)}$$

The effect is to consume the small particles and weld together the big ones to create macroscopic circuit conductors of pure metal. In place of acid, some other active organic reagent which will produce an easily decomposed metallo-organic compound from either the oxide or the metal could be used. An example would be the use of sulfur compounds to make mercaptides or nitrogen ligands to produce decomposable complexes.

Examples of useful compounds are soaps of carboxylic acids, in which the hetero-atom is oxygen; amino compounds, in which the hetero-atom is nitrogen; and mercapto compounds, in which the hetero-atom is sulfur.

Specific examples of preferred ROM constituents are the carboxylic acids and the corresponding metallic soaps of neodecanoic acid and 2-ethyl hexanoic acid with silver and copper, such as. silver neodecanoate illustrated by the formula:

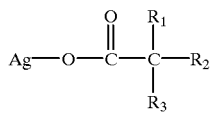

where $R_1$, $R_2$, and $R_3$ are $C_9H_{19}$
and silver 2-ethyl hexanoate as illustrated by the formula:

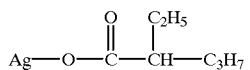

Gold amine 2-ethyl hexanoate is an example of a nitrogen compound.:

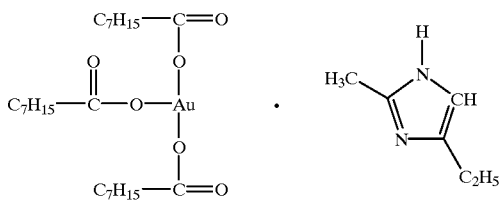

Gold amine 2-ethyl hexanoate (gold amine octoate)

Gold Amine 2-ethyl Hexanoate (Gold Amine Octoate)
Gold t-dodecyl mercaptide is an example of a sulfur compound:

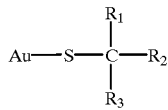

where $R_1$, $R_2$, and $R_3$ are $C_{11}H_{23}$

These ROM compositions can be made by methods well known in the art. All of the above compounds are capable of decomposition to the respective metals at relatively low temperatures. For the silver neodecanoate and silver 2-ethyl hexanoate (silver octoate), the decomposition temperature is between 200 and 250° C. For the corresponding copper compounds, it is between 300 and 315 C. Gold sulfides decompose at very low temperatures in the neighborhood of 150° C. Gold amine octoate decomposes between 300 and 500° C. The copper and silver compounds can be reformed from the corresponding acids at the same temperature, so the reaction is reversible, as mentioned above.

In some cases it is convenient to add rheology-enhancing compounds well known in the art to improve the printing characteristics of the compositions of the invention. Alpha-terpineol has been used to reduce the viscosity of copper and silver compositions to facilitate screen printing. Alpha-terpineol also participates in the consolidation reaction by virtue of the acid character of the OH group bonded to an unsaturated ring. By selecting constituents and additives, it has proven possible to produce a range of printable compositions ranging from fluid inks with a viscosity of 15 centipoise to solid powders.

The composition is printed on the substrate using any convenient printing technology. Screen printing and stencil-ing are suitable for rigid substrates in relatively small numbers with high resolution. Gravure printing, impression printing and offset printing are suitable for high production rates on flexible substrates. Ink jet printing and electrostatic printing offer the additional advantage of direct computer control of the printed image. This permits circuits to be printed directly from Computer Aided Design (CAD) files and eliminates the need for special tooling. Each circuit can be different, if desired, for coding or prototyping. The same end can be achieved at lower production rates with computer-controlled dispensing equipment. This equipment produces dots or lines by moving a needle over the surface and dispensing printing composition supplied by a pump or pressurized syringe.

PARMOD™ compositions have been applied by screen printing, stenciling, dispensing, gravure printing, ink jet printing, impression printing, offset printing and electrostatic printing. Alternative application methods include coating an adhesive pattern with a dry powder composition or toner. Screening, as used in applying conventional thick film pastes has been used most extensively for preparing samples for evaluation. A composition with a viscosity of approximately 500 poise is forced through a fine screen with a photo-defined open image of the desired conductor pattern in it by a rubber squeegee. The resolution which has been achieved by this method is approximately 125 micron (5 mil) lines and spaces, although production screen printers can achieve patterns as fine as 50 microns. Conductive traces with thicknesses up to 50 microns have been printed, though most of the test patterns have been in the neighborhood of 12 microns thick, which is equivalent to 0.37 ounces of copper per square foot.

When the metallo-organic decomposition compound or the acid from which it is formed is mixed with the metal flake and colloidal metal powder constituents described above, printed as a relatively thin layer on an appropriate substrate, and heated to a critical temperature above the decomposition temperature of the metallo-organic compound, a reaction takes place which results in the sudden consolidation of the loosely aggregated metal constituents into a nearly solid metal trace with greatly reduced electrical resistivity. Scanning Electron Micrograph cross sections of traces which have been heated to decompose the metallo-organic compound but below the critical temperature for copper and for silver mixtures show the individual metal flakes and powder particles, much like a picture of the unheated mixture.

When the traces are heated above the critical temperature, there is a very rapid decrease in electrical resistivity, a dramatic increase in mechanical cohesive strength of the deposit and the appearance of the deposits changes. SEM cross sections of copper, silver and gold mixtures that have been heated above the critical temperature show that the metal flake and powder have consolidated into a bonded network of solid metal.

The compositions are cured by exposure to heat for a short period of time. This time varies with the temperature to which the substrate can safely be exposed, but is less than a minute to achieve most of the electrical conductivity of which the composition is capable, and in some cases is less than 10 seconds at temperature.

For copper (and gold) the critical temperature is in excess of 300° C. Between 305 and 325° C. the resistivity of copper traces dropped by a factor of 100 to a value below 10 microohm-cm. The bulk resistivity of copper is 1.7 microohm-cm. At the same temperature at which the resistivity drops the mechanical properties of the traces improved equally dramatically. From being brittle and poorly adherent as measured by creasing the samples and pulling the traces off with Scotch Tape the samples become ductile enough to survive a sharp 180 degree crease in the 75 micron (3 mil) substrate followed by tape testing. The crease test is equivalent to an elongation of the metal trace of 17%. The tape test is equivalent to an adhesion of approximately 10 Newtons/cm (6 lb per lineal inch). Heating to still higher temperatures decreases the resistivity only slightly.

For silver, the decrease in resistivity with processing temperature is not as dramatic as with copper but the conversion from a poorly-consolidated material which is easily fragmented to a ductile metal is equally sharp. The critical temperature is approximately 230° C.

The critical temperature can be adjusted by mixing metallo-organic constituents. As mentioned above, gold amine octoate decomposes at temperatures up to 500° C. This is too high for use with temperature sensitive substrates/layers such as amorphous silicon and polymer-based printed circuit substrates or most other electronic components. Gold t-dodecyl mercaptide decomposes at approximately 150° C. This is too low to bond effectively with the substrates of interest or with added gold flake. Gold neodecanoate decomposes at about 120–154° C. A mixture of gold amine octoate and gold neodecanoate has been used to achieve a decomposition temperature in the desirable range.

Both gold and silver mixtures can be heated in air since the elemental metals are the stable form at the temperature at which the metallo-organic constituent decomposes. Copper, however, requires the use of a protective atmosphere to prevent the formation of copper oxide which is the stable product of decomposition in air. A nitrogen atmosphere containing less than about 20 and most preferably less than 3 ppm by volume of oxygen has been found to be suitable. Addition of water vapor in the amount of about 5% has proven to be helpful in improving the conductivity of the resulting deposits.

Copper and silver Parmod™ compositions have been printed on both low alkali glass and polyimide films coated with various adhesive layers and thermally cured to create flexible printed circuits. Suitable substrates are DuPont Kapton type FN with a FEP Teflon coating and types KJ and LJ with low melting polyimide coatings. Copper Parmod™ compositions have been printed on rigid polyimide-glass laminates coated with a low melting polyimide adhesive and thermally cured to create rigid printed circuits. Silver Parmod™ compositions have been printed on certain grades of FR-4 epoxy-glass laminates and thermally cured to produce well-bonded rigid printed circuits, although in general an adhesive layer will be required for silver as well. Silver Parmod™ compositions have been printed directly on certain grades of FR-4 epoxy-glass laminates and thermally cured to produce well-bonded rigid printed circuits, although in general an adhesive layer will be required for silver as well, and the resistivity of the silver traces is lower on polyimide-coated epoxy.

The examples described below indicate how the individual constituents of the preferred compositions and the conditions for applying them function to provide the desired result. The examples will serve to further typify the nature of this invention, but should not be construed as a limitation in the scope thereof which scope is defined solely in the appended claims.

EXAMPLE 1

Electrostatic Printing of Simulated Gate Lines on Glass

A liquid toner using PARMOD™ technology can be used for high-resolution electrostatic printing. The toner, from example 5A, is comprised of particles dispersed in an insulating liquid dispersant (Isopar G, Exxon Corp.) with a charge director such as that produced by Indigo. Toner E-43 has been used to electrostatically print high resolution, highly conductive fine lines on Corning 7059 glass.

Electrostatic printing was completed as follows. A grounded, photoimaged printing plate was electrostatically charged by passing a 5000 V corona over it. Liquid toner was then applied to the printing plate to develop the latent electrostatic image. The image was then washed with liquid dispersant to remove excess toner. The image was then transferred across a 25 micron, liquid dispersant-filled gap, to a Corning 7059 glass substrate by passing a 1250 V corona over the back of the glass substrate. The electrostatic charge of the corona caused the toner particles on the developed image to move across the 1 mil gap and deposit on the glass substrate. The glass was then carefully removed and allowed to dry at room temperature.

The transferred image was then heated to 400° C. for 5 minutes to give a continuous, pure silver film with good adhesion. The electrical resistivity was 1.7 $\mu\Omega$-cm. High resolution images with 80 $\mu$m wide lines and 80 $\mu$m wide spaces have been obtained. The average thickness of the lines was about 500 nm with tapered edges.

EXAMPLE 2

Printing Thin Film Transistors with Silver Source and Drain Metallization

Except for the top source/drain metallization, which was screen-printed, all the other TFT layers were prepared in a standard way and patterned using lithography. A set of photolithographic masks and a screen for printing source/drain patterns were fabricated to provide an array of 28 TFTs with four different channel lengths: 75, 100, 125, and 150 microns. The channel width was 500 microns. First, a 100 nm thick chromium layer was thermally evaporated and wet etched to create the gate electrode. Then the following sequence of layers was deposited in a three-chamber PECVD deposition system: 400 nm of $SiN_x$, 200 nm of undoped a-Si:$H_x$, and 50 nm of ($n^+$)a-Si:$H_x$. A 30 nm thick Pt layer was e-beam evaporated. The Pt was etched and the ($n^+$) a-Si:$H_x$ was dry etched in $CF_4$ gas. Then the undoped a-Si:$H_x$ was dry etched to define the transistor islands. In the last photolithographic step, windows were dry etched into the $SiN_x$ to open access to the gate contact pad. The performance of the transistors was measured before the screen printing of the source/drain silver contacts.

The silver was printed on the platinum layer and the sample was heat treated in an air atmosphere at 250° C. for 5 minutes. The silver/platinum interface maintained good adhesion. The electrical performance of the TFTs was measured after the silver was printed.

Figure 14:
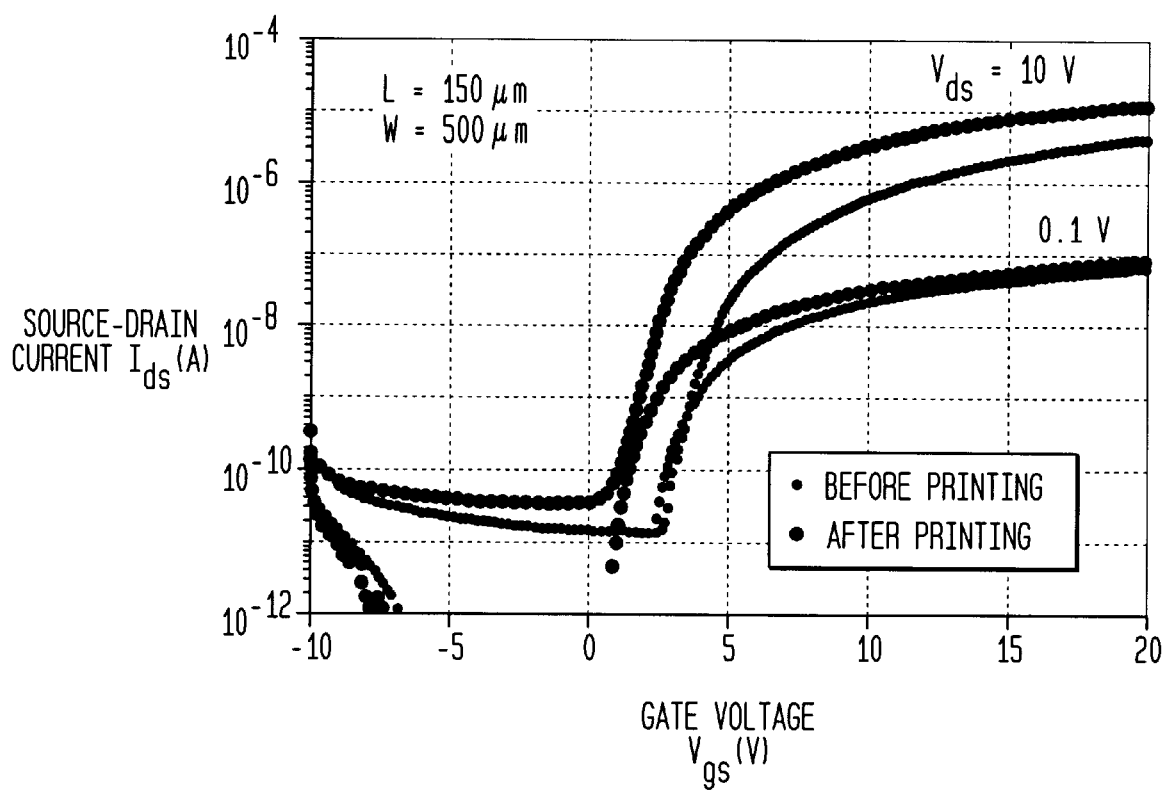

The TFT characteristics were measured with an HP Parameter Analyzer. The source/drain current, $I_{ds}$, was measured as a function of the gate voltage, $V_{gs}$, for two different source/drain voltages, $V_{ds}$=0.1 and 10 V. The gate voltage was swept from −10 V to 20 V with a step of 0.1 V. The TFTs with different gap sizes were measured before and after the silver was screen-printed. FIG. 14 shows the measured TFT characteristics of one TFT with a channel length of 150 microns.

In the linear approximation, the source/drain current is given by:

$$I_{ds}=[(W/L)(C_{SiN})(\mu_n)][(V_{gs}-V_T)(V_{ds})-(V^2_{ds}/2)]$$

where W is the channel width, L the channel length, $C_{SiN}$ the capacitance of the gate insulator, $\mu_n$ the effective electron mobility, and $V_T$ the threshhold voltage. Before the silver contacts were printed, the off-current was $1.4\times10^{-11}$ A, the on-current was $4.3\times10^{-6}$ A, and the on/off current ratio was $3\times10^5$. At $V_{ds}$=0.1 V we obtained $V_T\approx5.2$ V and a value of $4.56\times10^{-9}$ $AV^{-1}$ for the ($C_{SiN}\mu_n V_{ds}W/L$) product. Assuming a dielectric constant of 7, $C_{SiN}$=$1.5\times10^{-8}$ $Fcm^{-2}$, and the calculated linear mobility is $\approx 0.9$ $cm^2V^{-1}s^{-1}$.

After printing the silver, the off-current was $3.3\times10^{-11}$ A, the on-current was $1.3\times10^{-5}$ A, and the on-off current ratio was $4\times10^5$. At $V_{ds}$=0.1 V, we obtained $V_T\approx4V$ and the linear mobility of $\equiv1$ $cm^2V^{-1}s^{-1}$. There is an improvement in the on-current, the threshold voltage, and the mobility, after the addition of the silver source/drain contacts. The on-current increased by a factor of three, indicating that the contacts improved after the printing/annealing procedure associated with the printed silver. At the same time, the off-current increased by a factor of about 2 . The threshold voltage decreased from 5.2 to 4V and the linear mobility increased from 0.9 to 1 V. Except for the slightly higher off-current, the measured characteristics are typical for high-quality a-Si:$H_x$ TFTs, indicating the feasibility of the Pt/Ag contact.

EXAMPLE 3

Printing Indium Tin Oxide

Printable mixtures of Indium Tin Oxide have been formulated by mixing ITO powder with metallo-organic decomposition compounds of indium and tin. 4,6 grams of 95:5 ITO powder form Arconium Corp. was mixed with 5.4 grams of indium 2-ethylhexanoate and 0.8 grams of tin 2-ethylhexanoate. Fifty drops of neodecanoate acid and 5 drops of α-terpineol were added as rheology modifiers and the mixture was roll milled to homogenize it. The ink was screen printed on a mica substrate and thermally decomposed in air. Treatment at 325 degrees C. for 10 minutes gave a sheet resistance of 1 KΩ per square at 25 microns thickness. Treatment at 400° C. for 90 minutes gave 250 Ω per square. The films were translucent to clear and amber to white in color.

The three major components of PARMOD™ based liquid metallic toners are 1) metallic toner particles comprised of metal particles and metallo-organic decomposition (MOD) compound, 2) one or more charge director(s), and 3) a non-polar dispersing solvent. The MOD constituent of the toner particles is important because it interacts with the charge director(s) to impart a charge on the particles. The MOD, along with the charge director, can be used to vary the charge to mass ratio of the particles which is important to good electrostatic imaging. The MOD and the charge director also work in tandem to provide dispersability of the particles in the non-polar dispersing solvent. The MOD also allows for the PARMOD™ type consolidation of the metallic toner particles into a continuous metal film/conductor.

Metals which can be used as toner particles include copper, silver, gold, zinc, cadmium, palladium, iridium, ruthenium, osmium, rhodium, platinum, iron, cobalt, and nickel, (Groups Ib, IIb, and VIII), and indium, tin, antimony, lead, and bismuth The MOD of the toner particles can be formed as the particles are being formed in a metal precipitation reaction. The metal precipitation reaction is performed by dissolving or suspending a metal salt in the MOD compound it is to be combined with, and heating the solution or suspension to decompose the metal salt to form metal particles. As the metal particles form, they will reach a certain particle size at which point the solvent (organic medium) will react with the surface forming a MOD coating on the particles, thus stabilizing them at that particle size. It is believed that this process not only coats the metal particles but that some of the MOD compound is also incorporated amongst the metal particles. The restraint on this reaction is that the metal salt chosen for decomposition must have a lower decomposition temperature than the coating "salt" formed on the surface of the particle. This process is similar to the process disclosed in U.S. Pat. Nos. 4,186,244 & 4,463,030, both issued to Deffeyes. In one example the powder is made by thermally decomposing silver oxalate in a carboxylic acid (such as oleic acid). The resulting silver powder particles contain incorporated carboxylate and are effectively coated with the carboxylate.

When commercial metal particles are used, the MOD coating compound can be added to uncoated particles and adsorbed on the surface. This is accomplished by mixing the metal particle and the coating compound together in the dispersing medium. In the case of most metals, the coating compound will adsorb on the surface of the particles once mixed into the dispersing medium. This adsorption will give some amount of dispersability to the metal particles, depending on the coating compound used and its properties in the dispersing medium.

Preferred coating compounds are generally long chain carboxylic acids. The long organic chain provides dispersability in the dispersing solvent and the carboxylate functional group allows for strong adsorption on the metal particle surface. The functional group on the coating compound can be any ionizable group that would create an O, N, S, or P linkage with the metal particle surface. These types of linkages are important since the coating on the metal particles encompasses the PARMOD™ technology and enables the consolidation of the particles into a continuous film. The organic part of the compound can be a long chain, a branched chain, or contain cyclic groups, as long as it has solubility or micellular properties conducive to a non-polar organic solvent. The coatings on the metal particles that can be used include carboxylic acids, metal carboxylates, thiols, amines, alkoxides, and phosphines.

Commercially available metal powder or flake can also be used and coated with silver neodecanoate. As an example, this is done by adding silver powder or flake to silver neodecanoate just after it has been synthesized and is still an 'oil'. The silver neodecanoate then forms a coating on the silver powder or flake. This 'oily' powder or flake can then be 'dried' (as the silver neodecanoate would be) by washing with methanol to give a dry powder.

The MOD coatings also function as a Charge Control Agent within the liquid toners. The charge control agents in the toners are preferably the MOD coatings on the metal particles. In general, a charge control agent must either be insoluble in the carrier solvent or be bound to the toner particle. It must be structurally capable of interacting with the charge director to generate the charge on the toner particle. Some examples of charge control agents are aluminum salts of organic acids, quaternary ammonium salts, and low molecular weight organic acids. Preferred charge control agents are carboxylic acids such as neodecanoic acid, neoheptanoic acid, neopentanoic acid, 2-ethyihexanoic acid, oleic acid, and silver neodecanoate.

The main function of the charge director is to provide the charge on the toner particles. As such, it also acts as a dispersing agent. The general properties of a charge director include its solubility in the carrier liquid, its ability to structurally interact with the charge control agent to provide the charge on the toner particle, and it should not be "very" hygroscopic. In general this means a molecule that contains an ionizable functional group as well as an organic portion which is soluble in the carrier solvent. In relation to the 'structural interaction with the charge control agent', the charge director's functional group should be able to interact ionically with the charge control agent, without being sterically inhibited by the organic portion.

The charge directors are thought to impart charge to the particles by forming inverse-micelles in the non-polar dispersing solvent. These inverse micelles then solubilize the ionic functional group of the organic coating compound, allowing ionization and the creation of a charge at the surface of the metal particle by proton transfer for example. By using a charge director separate from the coating on the particle, it is possible to vary the amount of charge widely, without having an effect on the PARMOD™ chemistry involved in curing the metal particles to a continuous film. A charge director will create a different amount of charge on the same particles depending on the micellular properties of the charge director in the dispersing solvent. Therefore, different charge directors present in the same concentration will provide different amounts of charge. By varying the concentration of the charge director, the solution conductivity can be varied and the charge to mass ratio for the particles can be controlled. This is very important because the amount of charge on the particles and the amount of excess conductivity in the solution strongly affect the quality of the developed latent image and the ability to transfer a good quality image to another substrate. Enough of the charge director is used to obtain a preferred solution conductivity of between about 3 and about 100 pS/cm)

Surface active agents (surfactants) that have the properties described above can be used as charge directors. Examples of compounds which can be used as charge directors include alkali metal soaps, divalent and trivalent metal carboxylates (e.g., zirconium 2-ethylhexanoate, copper napthenate, or aluminum stearate), block copolymers, fatty amines (e.g., Troysol 98C), zwitterionic compounds (e.g., Lecithin), and sulphonated petroleum hydrocarbons also known as metal petronates (e.g., Basic Barium Petronate or Calcium Petronate), polymeric esters, phosphated diglycerides, sulfonates, functionalized diblock copolymers, and other ionic surfactant molecules.

Preferred charge directors include zirconium 2-ethylhexanoate, Troysol 98C, Lecithin, Basic Barium Petronate, and the Indigo Imaging agent, which is an NVP copolymer with lecithin and basic barium petronate integrated in the polymer and mixtures thereof. Preferred mixtures comprises lecithin and basic barium petronate in various ratios.

The dispersing solvent is a non-polar organic liquid with a vapor pressure such that it will evaporate relatively easily from the printed image, but not from the bulk liquid toner solution. The non-polar organic properties are necessary so that the solvent does not discharge the latent image as the toner particles develop it. The dispersing solvent acts as a carrier for the toner particles to get them to the latent image, but does not play a role in the PARMOD™ chemistry to form the continuous metal film. As with conventional liquid toners, once the desired image is formed, the dispersing solvent is removed by evaporation. Acceptable dispersing solvents include isoparaffinic hydrocarbons, halogenated or partially halogenated fluids and silicones. Some commercially available hydrocarbons include Isopar®, Norpar®, Shell-Sol®, and Soltrol®. The Isopar® series of isoparaffin solvents from Exxon Chemical are preferred as dispersing solvents, but other solvents with a resistivity greater than $10^{11}$ Ω-cm, a dielectric constant less than 3.5 and a boiling point in the range of 150–220° C., can also be used. The Kauri-butanol number (solvency) should be less than 30.

The photopolymer material, such as a dry film or liquid resist, typically is formed of polymers which become cross-linked to form the imaged areas having greater electrical resistivity that can be an order of magnitude or greater more dielectric than the background or unexposed areas. The desired electrostatic latent image pattern remains in the photopolymer material by using the material's ability to retain differences in resistivity for relatively long periods of time after having been exposed to actinic radiation to form cross-linked areas of increased resistivity and areas unexposed to the actinic radiation which remain the less resistive areas. Suitable dry film photoresists include those sold under the tradenames Riston 1215 and Riston 3615 by DuPont and BASF's 38 micron thick film supplied under the designation WN-0038. A liquid photopolymer could also be applied with a solvent to the conductive substrate and dried.

A substrate is coated with a photopolymer material on at least one side. Exposure to actinic radiation causes cross-linking of the polymers in the material. The cross-linked photopolymer material exhibits a change in resistivity. A permanent latent image can formed on the photopolymer material by actinicly radiating the photopolymer through a mask or phototool or by drawing the desired pattern on the photopolymer with a laser. Both methods cross-link the irradiated photopolymer resulting in differences in the resistivity between imaged and non-imaged areas on the photopolymer material. The imaged photopolymer surface is then charged with a corona charging device to produce a pattern of charge retention that corresponds to the pattern of cross-linked photopolymer.

The charged photopolymer surface is then developed by the application of liquid metallic toner particles that are charged oppositely to the charge on the photopolymer surface. It may be necessary to wait a sufficient length of time after charging for the electric charge field to dissipate from above the unexposed/uncross-linked areas of the photopolymer material before applying the toner particles. The charged liquid metallic toner particles are drawn to the charged areas of the photopolymer surface to form or develop the latent image.

The developed image thus is ready for 1) thermal curing to produce solid metal components or 2) transfer to an electrically isolated conductive receiving surface or a non-conductive receiving surface, such as by a xeroprinting process where a master with the permanent image which is mounted to a grounded conductive backing, is charged, developed by the application of toner particles and the developed image is electrostatically transferred to another receiving surface to produce a circuit board with the desired conductive wiring pattern. This transfer method is more fully explained in, e.g., U.S. Pat. No. 3,004,860 issued to Gundlach, herein specifically incorporated by reference in pertinent part.

In a preferred embodiment, the photopolymer is developed on the end-product substrate, the liquid metallic toner is applied to the latent, charged image on the developed portion of the photopolymer and the substrate with photopolymer and toner is then heat treated to cure the PARMOD superscript TM toner particles and further cure the photopolymer.

In another embodiment the charged image is created using Ionography, in which the charged image is created by digitally controlled discharge from a row of electrodes. The image is toned with the liquid metallic toners and then transferred and cured or, cured in place, as previously described.

EXAMPLE 4

Preparation of Coated Particles

A. Oleate Coated Silver Nanopowder

An oleate coated silver powder was synthesized as follows: Silver oxalate (doped with 1% copper for heat stabilization) (20 g) is slurried into oleic acid (250 mL) by stirring with a magnetic stir bar. The solution is then heated on a hot plate with stirring to 185° C. for 90 minutes. The solution is then allowed to cool to room temperature and the dark gray precipitate settles to the bottom. The solvent is then carefully removed by pipette from the top of the precipitate. Then to remove the remaining solvent the precipitate is washed with 3×50 mL tetrahydrofuran (THF) by stirring the precipitate with the THF then allowing it to settle and then removing the THF by pipette from the top of the precipitate. The precipitate is then washed 3×50 ml with Isopar H in the same manner. Finally, the wet precipitate is dispersed in Isopar H (80 g) and treated ultrasonically for 30 minutes. This method gives a dispersion of silver particles with approximately 10% Ag (wt/wt).

B. Degussa Silver Flake Coated with Carboxylic Acid(s)

Degussa silver flake (2 g) was stirred together with oleic acid (0.1 g) in Isopar H (100 mL). The dispersion was ultrasonicated for 30 minutes. The oleic acid can be replaced with neodecanoic acid, noeheptanoic acid, neopentanoic acid, or 2-ethylhexanoic acid.

EXAMPLE 5

Dispersion and Charging of the Coated Particles

A. Oleate Coated Silver Nanopowder Toner,

The coated silver nanopowder from Example 1A (2 g) was ultrasonically dispersed in Isopar H (100 mL) for 30 minutes. To this dispersion was added enough Indigo Imaging Agent (IIA) to give a solution conductivity (as measured with a Scientifica 627 Conductivity Meter) of 2.7 pmho/cm.

B. Oleate Coated Silver Nanopowder Toner,

The coated silver nanopowder from Example 1A (2 g) was ultrasonically dispersed in Isopar H (100 mL) for 30 minutes. To this dispersion was added enough Troy Sol 98c (fatty amine) to give a solution conductivity of 0.7 pmho/cm.

C. Degussa Silver flake toner,

Degussa silver flake (2 g) coated with oleic acid was ultrasonically dispersed in Isopar H (100 mL) for 30 minutes. To this dispersion was added enough Troy Sol 98c to give a solution conductivity of 0.7 pmho/cm.

D. Degussa Silver Flake Toner, E-30

Degussa silver flake (2 g) coated with neodecanoic acid was ultrasonically dispersed in Isopar H (100 mL) for 30 minutes. To this dispersion was added enough IIA to give a solution conductivity of 7.0 pmho/cm.

EXAMPLE 6

Developing and Converting Electrostatic Images to Pure Silver

A. Dynachem 5038 Photopolymer Substrate

A grounded, photoimaged printing plate with a liquid photo resistant surface was electrostatically charged by passing a 5000V corona over it. Liquid toner from Example 2A was then applied to the printing plate to develop the latent electrostatic image. The image was then washed with Isopar H to remove excess toner. The image was then allowed to dry at room temperature (5 minutes). The developed image was then heated to 220° C. for 3 minutes to give a continuous, pure silver film. The electrical resistivity of the silver film was 5.7 $\mu\Omega$-cm compared with 1.59 $\mu\Omega$-cm for bulk silver. The silver film had good adhesion to the substrate. The adhesion of the silver to the substrate was determined by a Scotch tape test where the tape was applied to the conductor and peeled off. This exerts a peel force on the conductor of approximately 6 lb/in (1050 N/m).

B. Dry Film Solder Mask Substrate

The same printing process as Example 3A was used except that the printing plate had dry film solder mask on the surface. The developed and dried silver toner image was then heated to 260° C. for 3 minutes to give a continuous, pure silver film. The electrical resistivity of the silver film was 5.0 $\mu\Omega$-cm with good adhesion to the substrate.

EXAMPLE 7

Transferred and Cured Printed Images

A. Corning 7059 Low Alkali Glass Substrate

Printing of an electrostatic image was done as in Example 3A and the developed image was washed with Isopar H. Rather than drying the image, the image was then transferred across a 1 mil, Isopar H filled gap, to a Corning 7059 low alkali glass substrate. The transfer was done by creating a 1 mil gap with spacers on the surface of the printed image. The gap was filled with Isopar H and the glass substrate was placed on the spacers. A corona with a voltage of 1250 V was then passed over the substrate. The electrostatic charge of the corona caused the toner particles on the developed image to move across the 1 mil gap and deposit on the glass substrate. The glass was then carefully removed and allowed to dry at room temperature. The transferred image was then heated to 400° C. for 5 minutes to give a continuous, pure silver film. The electrical resistivity of sample was 1.7 $\mu\Omega$-cm with good adhesion to the substrate. High resolution images with 40 $\mu$m wide lines and 80 $\mu$m wide spaces could be obtained.

B. Kapton®H Flexible Substrate

With a flexible substrate, the gap transfer method was varied. The DuPont Kapton®H flexible substrate was taped to a conductive aluminum, 4 inch diameter roller. The 1 mil gap was created with spacers and filled with Isopar H as in Example 4A. The roller with the Kapton®H substrate was then placed on the spacers and a transfer voltage of 1250V was applied to the roller. The substrate was then rolled across the image. The developed image was transferred to the Kapton®H substrate. The substrate was then allowed to dry at room temperature (5 minutes) and removed from the roller. The image was heated to 350° C. for 3 minutes to give a continuous, pure silver film. The electrical resistivity of the silver film was 4.5 $\mu\Omega$-cm with good adhesion to the substrate.

While the invention has been described with reference to preferred embodiments thereof it will be appreciated by those of ordinary skill in the art that modifications can be make to the structure and form of the invention without departing from the spirit and scope thereof.

What is claimed:

1. A method for producing an array of one or more Thin Film Transistors comprising the steps of:
   a) printing a pattern of one or more high conductivity metallic gate lines on a substrate;
   b) covering said gate lines with a layer having a first sub-layer comprised of a silicon nitride gate dielectric, a second sub-layer comprised of a-Si:H, and a third sub-layer comprised of (n+) a-Si:H;
   c) printing a pattern of one or more sets of drain, source, and data line conductors;
   d) depositing one or more Indium Tin Oxide pixels;
   wherein said gate lines are printed by applying a composition comprising a Reactive Organic Medium (ROM) and metal in a pattern of said one or more gate lines and then heating said pattern to form metal conductors.

2. The method of claim 1 wherein said pattern of one or more sets of drain, source, and data line conductors is printed by applying a composition comprising a Reactive Organic Medium (ROM) and metal in the pattern and then heating said pattern to form metal conductors.

3. The method of claim 1 wherein said one or more Indium Tin Oxide pixels are printed by applying a composition comprising a Reactive Organic Medium (ROM) and Indium Tin Oxide and then heating said composition to form Indium Tin Oxide conductors.

4. The method of claim 1 wherein said said substrate is glass.

5. The method of claim 1 wherein said first sub-layer is applied using a PECVD process.

6. The method of claim 1 wherein said second sub-layer is applied using a PECVD process.

7. The method of claim 1 wherein said third sub-layer is applied using a PECVD process.

* * * * *